(12) United States Patent
Chao

(10) Patent No.: US 12,527,010 B2
(45) Date of Patent: Jan. 13, 2026

(54) METHOD FOR FORMING SEMICONDUCTOR STRUCTURE, LAMINATE STRUCTURE, AND METHOD FOR FORMING LAMINATE STRUCTURE

(71) Applicant: CHANGXIN MEMORY TECHNOLOGIES, INC., Hefei (CN)

(72) Inventor: Chengfang Chao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 750 days.

(21) Appl. No.: 17/809,170

(22) Filed: Jun. 27, 2022

(65) Prior Publication Data

US 2023/0187480 A1  Jun. 15, 2023

Related U.S. Application Data

(63) Continuation of application No. PCT/CN2022/088474, filed on Apr. 22, 2022.

(30) Foreign Application Priority Data

Dec. 13, 2021  (CN) .......................... 202111521993.3

(51) Int. Cl.
  *H10D 1/00*  (2025.01)
  *H01L 21/285*  (2006.01)
  (Continued)

(52) U.S. Cl.
  CPC ....... *H10D 1/042* (2025.01); *H01L 21/28568* (2013.01); *H01L 21/31116* (2013.01); *H10D 1/716* (2025.01); *H10B 12/00* (2023.02)

(58) Field of Classification Search
  CPC .. H10D 1/042; H10D 1/716; H01L 21/28568; H01L 21/31116; H10B 12/00
  (Continued)

(56) References Cited

U.S. PATENT DOCUMENTS 6,461,913 B2 * 10/2002  Hong ..................... H10D 1/696
                                                                         438/653
9,941,291 B2 *  4/2018  Lee ......................... H10B 69/00
(Continued)

FOREIGN PATENT DOCUMENTS

CN  101593719 B  8/2010
CN  111524794 A  8/2020
CN  112786537 A  5/2021

*Primary Examiner* — Jami Valentine Miller
(74) *Attorney, Agent, or Firm* — Syncoda LLC; Feng Ma

(57) ABSTRACT

A method for forming a semiconductor structure and a method for forming a laminate structure include the following operations. A laminate structure is provided, the laminate structure including a plurality of sacrificial layers and a plurality of support layers alternately stacked on one another, each support layers includes a plurality of doped areas and a plurality of body areas. A first etching process is performed to form a plurality of first gaps penetrating through the plurality of body areas and the plurality of sacrificial layers in the laminate structure. A first material layer is deposited on inner walls of the plurality of first gaps. A second etching process is performed to remove the plurality of doped areas and the plurality of sacrificial layers to form a second gap between any two adjacent first gaps.

18 Claims, 7 Drawing Sheets

(51) Int. Cl.
*H01L 21/311* (2006.01)
*H10D 1/68* (2025.01)
*H10B 12/00* (2023.01)

(58) Field of Classification Search
USPC .......................................................... 257/342
See application file for complete search history.

(56) References Cited

U.S. PATENT DOCUMENTS

| | | | |
|---|---|---|---|
| 10,141,330 B1* | 11/2018 | Lindsay | H01L 21/76805 |
| 2018/0096890 A1* | 4/2018 | Clevenger | H01L 21/28568 |
| 2021/0351194 A1* | 11/2021 | Hsu | H10D 30/0411 |
| 2022/0077190 A1* | 3/2022 | Lim | C23C 16/56 |
| 2025/0254868 A1* | 8/2025 | Lee | G11C 5/06 |

* cited by examiner

METHOD FOR FORMING SEMICONDUCTOR STRUCTURE, LAMINATE STRUCTURE, AND METHOD FOR FORMING LAMINATE STRUCTURE

CROSS-REFERENCE TO RELATED APPLICATIONS

This is a continuation of International Patent Application No. PCT/CN2022/088474 filed on Apr. 22, 2022, which claims priority to Chinese Patent Application No. 202111521993.3 filed on Dec. 13, 2021. The disclosures of these applications are hereby incorporated by reference in their entirety.

BACKGROUND

A Dynamic Random Access Memory (DRAM) is a semiconductor storage device commonly used in a computer. The DRAM is composed of many duplicate memory cells. Each memory cell includes a transistor and a capacitor. A gate of the transistor is connected to a word line, a drain of the transistor is connected to a bit line, and a source of the transistor is connected to the capacitor. A voltage signal on the word line can control the turning on or turning off of the transistor, such that the data information stored in the capacitor is read through the bit line, or the data information is written into the capacitor through the bit line for storage.

In some implementations, during manufacturing the capacitor, it is usually necessary to open a top support structure firstly to remove the sacrificial material below the top support structure, then open a middle support structure to remove the sacrificial material below the middle support structure, and finally deposit a high-k dielectric material and an electrode plate material to form the capacitor. Therefore, the manufacturing process for the capacitor in some implementations is complicated.

SUMMARY

The disclosure relates to the technical field of semiconductors, and relates, but is not limited, to a method for forming a semiconductor structure, a laminate structure, and a method for forming a laminate structure.

In view of this, the embodiments of the disclosure provide a method for forming a semiconductor structure, a laminate structure, and a method for forming a laminate structure.

In a first aspect, an embodiment of the disclosure provides a method for forming a semiconductor structure, which includes the following operations.

A laminate structure is provided, in which the laminate structure includes a plurality of sacrificial layers and a plurality of support layers alternately stacked on one another, each of the plurality of support layers includes a plurality of doped areas and a plurality of body areas, and a hardness of each of the plurality of doped areas is lower than a hardness of each of the plurality of body areas.

A first etching process is performed to form a plurality of first gaps penetrating through the plurality of body areas and the plurality of sacrificial layers in the laminate structure.

A first material layer is deposited on inner walls of the plurality of first gaps.

A second etching process is performed to remove the plurality of doped areas and the plurality of sacrificial layers to form a second gap between any two adjacent first gaps of the plurality of first gaps.

In a second aspect, an embodiment of the disclosure provides a laminate structure, which includes a plurality of sacrificial layers and a plurality of support layers alternately stacked on one another.

Each of the plurality of support layers includes a plurality of doped areas and a plurality of body areas, and a hardness of each of the plurality of doped areas is lower than a hardness of each of the plurality of body areas.

In a third aspect, an embodiment of the disclosure provides a method for forming a laminate structure. The laminate structure is arranged on a surface of a base. The method includes the following operations.

A plurality of sacrificial layers and a plurality of initial support layers are sequentially and alternately formed on the surface of the base.

Ion implantation is performed on a portion of each of the plurality of initial support layers to form a plurality of support layers each including a plurality of doped areas and a plurality of body areas.

A hardness of each of the plurality of doped areas is lower than a hardness of each of the plurality of body areas.

BRIEF DESCRIPTION OF THE DRAWINGS

In the accompanying drawings (which are not necessarily drawn to scale), similar reference numerals may denote similar components in different diagrams. The similar reference numerals having different letter suffixes may denote different examples of the similar components. The accompanying drawings generally illustrate various embodiments discussed in the disclosure by way of example and not by way of limitation.

DESCRIPTION OF REFERENCE NUMERALS

Figure 1:
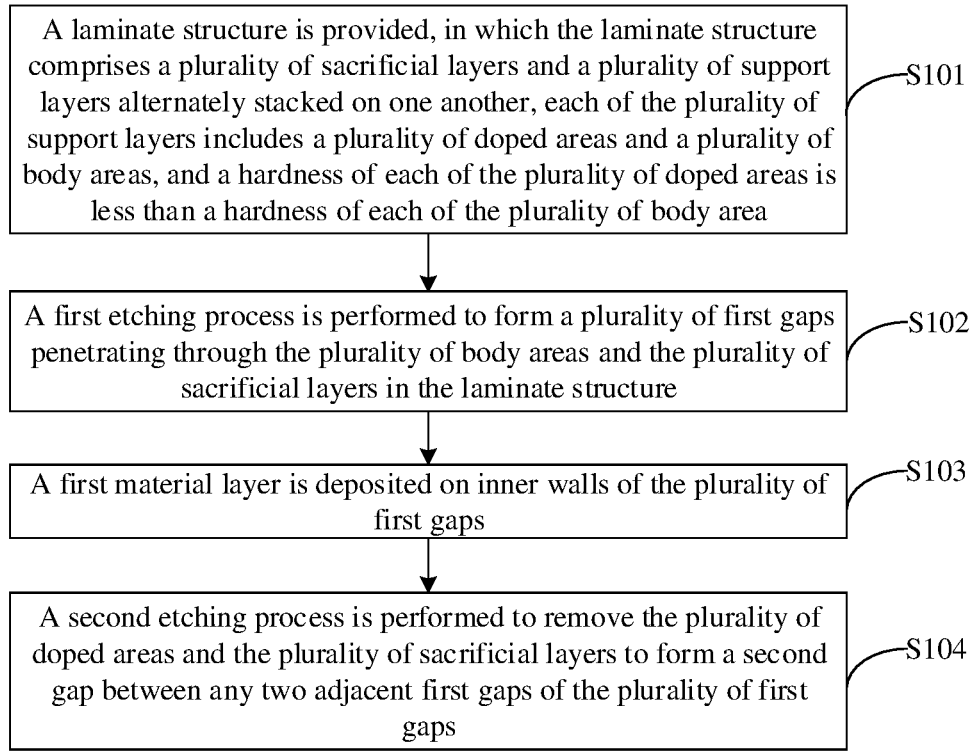
FIG. 1 is a flowchart of a method for forming a semiconductor structure according to an embodiment of the disclosure.

200—base; 201/301—bottom support layer; 202/302—first sacrificial layer; 203a—first initial support layer; 203/303—first support layer; 204—first photoresist layer; 205/304—second sacrificial layer; 206a—second initial support layer; 206/305—second support layer; 207—second photoresist layer; 208—patterned mask layer; 209a—first gap; 209b—second gap; 210—stack structure; 211—first material layer; 212—second material layer; 213—third material layer; 214—conductive material; 30—laminate structure; B1/303b—first body area; B2/305b—second body area; D1/303a—first doped area; D2/305a—second doped area; and C—preset pattern.

DETAILED DESCRIPTION

Exemplary embodiments of the disclosure will be described in more detail below with reference to the accompanying drawings. Although the exemplary embodiments of the disclosure are shown in the accompanying drawings, it should be understood that the disclosure can be implemented in various forms and cannot be limited by the specific embodiments illustrated herein. On the contrary, these embodiments are provided to more thoroughly understand the disclosure and to completely convey the scope of the disclosure to those skilled in the art.

In the following description, numerous specific details are set forth in order to provide a more thorough understanding of the disclosure. However, it will be apparent to those skilled in the art that the disclosure can be implemented without one or more of these details. In other examples, in order to avoid confusion with the disclosure, some technical features known in the art are not described. That is, all the features of the actual embodiments are not described here, and the well-known functions and structures are not described in detail.

In the accompanying drawings, the sizes and relative size of layers, areas, and elements may be exaggerated for clarity. The same reference numerals denote the same elements throughout the disclosure.

It should be understood that, when an element or layer is described as being "on", "adjacent to", "connected to" or "coupled to" another element or layer, it can be directly on, adjacent to, connected to, or coupled to the other element or layer, or there can be an intermediate element or layer. In contrast, when an element is described as being "directly on", "directly adjacent to", "directly connected to" or "directly coupled to" another element or layer, there are no intermediate element or layer. It should be understood that although the terms "first", "second", "third" and so on may be used to describe various elements, components, regions, layers, and/or portions, these elements, components, regions, layers, and/or portions should not be limited by these terms. These terms are used merely to distinguish an element, component, region, layer, or portion from another element, component, region, layer, or portion. Therefore, a first element, component, region, layer, or portion discussed below may be described as a second element, component, region, layer, or portion without departing from the teachings of the present disclosure. When the second element, component, region, layer or portion is discussed, it does not mean that the first element, component, region, layer or portion is necessarily present in the present disclosure.

Terms used herein are for the purpose of describing specific embodiments only and are not intended to be limiting of the disclosure. As used herein, "a/an", "one", and "the" in singular forms are also intended to include a plural form unless the context clearly indicates other forms. It should also be understood that the terms "consist" and/or "include" when used in the specification, determine presence of the features, integers, steps, operations, elements, and/or components, but do not exclude the presence or addition of one or more other features, integers, steps, operations, elements, components, and/or groups. As used herein, the term "and/or" includes any and all combinations of the related listed items.

Based on the problems in some implementations, the embodiments of the disclosure provide a method for forming a semiconductor structure, a laminate structure, and a method for forming a laminate structure. The method for forming the semiconductor structure includes the following operations. A laminate structure is provided, in which the laminate structure includes a plurality of sacrificial layers and a plurality of support layers alternately stacked on one another, each of the plurality of support layers includes a plurality of doped areas and a plurality of body areas, and a hardness of each of the plurality of doped areas is lower than a hardness of each of the plurality of body areas. A first etching process is performed to form a plurality of first gaps penetrating through the plurality of body areas and the plurality of sacrificial layers in the laminate structure. A first material layer is deposited on inner walls of the plurality of first gaps. A second etching process is performed to remove the plurality of doped areas and the plurality of sacrificial layers to form a second gap between any two adjacent first gaps of the plurality of first gaps. In the embodiments of the disclosure, each support layer includes doped areas with a lower hardness. Thus, in the subsequent process, the doped areas with the lower hardness and the sacrificial layers can be simultaneously removed by etching, so that the manufacturing process of the semiconductor structure is simplified.

An embodiment of the disclosure provides a method for forming a semiconductor structure. FIG. 1 is a flowchart of a method for forming a semiconductor structure according to an embodiment of the disclosure. As shown in FIG. 1, the method for forming the semiconductor structure includes the following operations.

In S101, a laminate structure is provided. The laminate structure includes a plurality of sacrificial layers and a plurality of support layers alternately stacked on one another, each of the plurality of support layers includes a plurality of doped areas and a plurality of body areas, and a hardness of each of the plurality of doped areas is lower than a hardness of each of the plurality of body areas.

In the embodiments of the disclosure, the laminate structure may be configured to form a capacitor structure. The laminate structure includes sacrificial layers and support layers sequentially and alternately stacked on one another.

The hardness of the support layer is greater than the hardness of the sacrificial layer, so that the support layer can support the subsequently formed capacitor structure, so as to prevent the capacitor structure from collapsing.

The support layer includes the doped areas and the body areas. The doped area is an area formed by performing ion doping on a portion of an initial support layer. In the embodiments of the disclosure, the doped areas and the body areas may be alternately arranged.

In the embodiments of the disclosure, compared with the body areas on which the ion doping is not performed, the doped area formed by performing ion doping on the initial support layer has a lower hardness, which is easier to be removed by etching.

In the embodiments of the disclosure, the support layer may be a silicon carbide layer or a silicon carbon nitride layer. The sacrificial layer may be an oxide layer or a doped oxide layer, such as a silicon oxide layer or Boro-phosphosilicate Glass (BPSG).

In S102, a first etching process is performed to form a plurality of first gaps penetrating through the plurality of body areas and the plurality of sacrificial layers in the laminate structure.

In the embodiments of the disclosure, the first etching process may be a dry etching process, and the first gap may be a capacitor hole. After the first gaps are formed in the laminate structure, the remaining laminate structure forms a stack structure.

In S103, a first material layer is deposited on inner walls of the plurality of first gaps.

In the embodiments of the disclosure, the first material layer may be a titanium nitride layer, a metal titanium layer, a titanium oxide layer or other metal film layers. The first material layer may be configured as an electrode plate of the capacitor structure, such as a lower electrode of the capacitor structure.

In S104, a second etching process is performed to remove the plurality of doped areas and the plurality of sacrificial layers to form a second gap between any two adjacent first gaps of the plurality of first gaps.

In the embodiments of the disclosure, the second etching process may be a wet etching process. The operation that the doped areas and the sacrificial layers are removed refers to simultaneously removing the doped areas in the stack structure and the sacrificial layers in the stack structure. For example, the doped areas in the stack structure and the sacrificial layers in the stack structure may be removed by a wet etching process by using a dilute hydrofluoric acid solution and a mixed solution of hydrofluoric acid and ammonium fluoride.

In the embodiments of the disclosure, the support layer includes doped areas with a lower hardness. Thus, in the subsequent process, the doped areas with the lower hardness and the sacrificial layers can be simultaneously removed by etching, so that the manufacturing process of the semiconductor structure is simplified.

FIG. 2A to FIG. 2M are schematic diagrams showing a structure in a forming process of a semiconductor structure according to an embodiment of the disclosure. Hereinafter, the method for forming the semiconductor structure provided by the embodiments of the disclosure is further described in detail with reference to FIG. 2A to FIG. 2M.

Firstly, with reference to FIG. 2A to FIG. 2F, S101 is performed, in which a laminate structure is provided. The laminate structure includes a plurality of sacrificial layers and a plurality of support layers alternately stacked on one another. Each support layer includes a plurality of doped areas and a plurality of body areas.

In the embodiments of the disclosure, the sacrificial layers include a first sacrificial layer 202 and a second sacrificial layer 205. The support layers include a first support layer 203 and a second support layer 206. The laminate structure includes the first sacrificial layer 202, the first support layer 203, the second sacrificial layer 205 and the second support layer 206 sequentially stacked on one another from bottom to top. The first support layer 203 includes first doped areas D1 and first body areas B1. The second support layer 206 includes second doped areas D2 and second body areas B2. The second doped areas D2 are arranged directly above the first doped areas D1. A hardness of the first doped area D1 is lower than a hardness of the first body area B1, and a hardness of the second doped area D2 is lower than a hardness of the second body area B2.

In some embodiments, the laminate structure further includes a bottom support layer 201. The first sacrificial layer 202 is arranged on a surface of the bottom support layer 201.

With reference to FIG. 2A to FIG. 2F, in some embodiments, the laminate structure is configured to form the capacitor structure. The laminate structure is formed on the base 200. The base 200 at least includes a contact structure (for example, a landing pad). The contact structure is configured to be electrically connected to the formed capacitor structure. In the embodiments of the disclosure, the material of the contact structure may be any conductive material, such as tungsten (W), cobalt (Co), copper (Cu), aluminum (Al), polycrystalline silicon, doped silicon, silicide, or any combination thereof.

With reference to FIG. 2A to FIG. 2F, in other embodiments, the base 200 may further include a semiconductor substrate, a word line structure arranged inside the semiconductor substrate, a bit line structure arranged on a surface of the semiconductor substrate, etc. The semiconductor substrate may be a silicon substrate. The semiconductor substrate may also include other semiconductor elements, such as germanium (Ge); or include semiconductor compounds, such as silicon carbide (SiC), gallium arsenide (GaAs), gallium phosphide (GaP), indium phosphide (InP), indium arsenide (InAs), or indium antimonide (InSb); or include other semiconductor alloys, such as silicon germanium (SiGe), gallium arsenide phosphide (GaAsP), indium aluminum arsenide (AlInAs), gallium aluminum arsenide (AlGaAs), indium gallium arsenide (GaInAs), indium gallium phosphide (GaInP), and/or indium gallium arsenide phosphide (GaInAsP) or a combination thereof.

With reference to FIG. 2A to FIG. 2F, the operation that the laminate structure is provided may include the following operations. The base 200 is provided. The bottom support layer 201, the first sacrificial layer 202 and a first initial support layer 203a are sequentially formed on a surface of the base 200. Ion implantation is performed on a portion of the first initial support layer 203a to form the first support layer 203. The second sacrificial layer 205 and a second initial support layer 206a are sequentially deposited and formed on the surface of the first support layer 203. Ion implantation is performed on a portion of the second initial support layer 206a to form the second support layer 206.

Figure 2A:
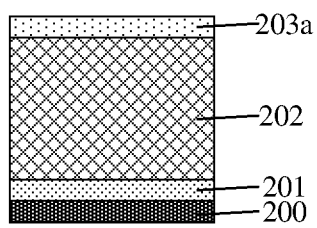
FIG. 2A is a first schematic diagram of a forming process of a semiconductor structure according to an embodiment of the disclosure.

As shown in FIG. 2A, the bottom support layer 201, the first sacrificial layer 202 and the first initial support layer 203 are sequentially formed on the surface of the base 200. In the embodiments of the disclosure, the bottom support layer 201 is a silicon nitride layer, the first sacrificial layer 202 is the BPSG, and the first initial support layer 203a is a silicon carbon nitride layer. In the embodiments of the disclosure, the bottom support layer 201, the first sacrificial layer 202, and the first initial support layer 203a may be formed through any suitable deposition process, such as a Chemical Vapor Deposition (CVD) process, a Physical Vapor Deposition (PVD) process, an Atomic Layer Deposition (ALD) process, a spin coating process, or a coating process. In the embodiments of the disclosure, since the hardness of the BPSG is lower than the hardness of silicon oxide, the relatively soft BPSG is used as the first sacrificial layer 202, which is beneficial to maintain the patterns in the etching process.

Figure 2B:
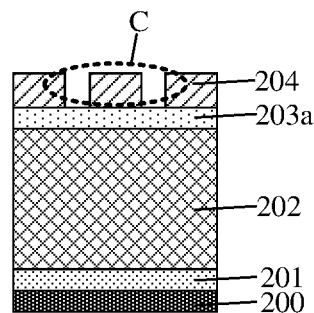
FIG. 2B is a second schematic diagram of a forming process of a semiconductor structure according to an embodiment of the disclosure.
Figure 2C:
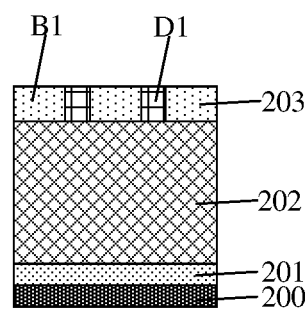
FIG. 2C is a third schematic diagram of a forming process of a semiconductor structure according to an embodiment of the disclosure.

As shown in FIG. 2B and FIG. 2C, the first support layer 203 includes first doped areas D1 and first body areas B1. The first doped areas D1 are formed by performing ion implantation on a portion of the first initial support layer 203a. For example, the first doped areas D1 may be formed by the following operations. A first photoresist layer 204 is formed on a surface of the first initial support layer 203a, in which the first photoresist layer 204 includes preset patterns C, and the preset patterns C expose a portion of the surface of the first initial support layer 203a. Ion implantation is performed on the exposed first initial support layer 203a, so as to form the first doped areas D1.

With reference to FIG. 2B and FIG. 2C, in the embodiments of the disclosure, atoms with small atomic numbers, such as hydrogen atoms, helium atoms or boron atoms, may be used to perform ion implantation on the exposed first initial support layer 203a under the process parameters that the ion implantation angle is comprised between 0 degree and 55 degrees, the ion implantation energy is comprised between 1000 electron volts and 100000 electron volts, and the ion implantation dose is comprised between $10^{13}$ atoms/$mm^2$ and $10^{16}$ atoms/$mm^2$, so as to form the first doped areas D1 as shown in FIG. 2C. The portion of the first initial support layer 203a covered by the first photoresist layer 204 is not subjected to the ion implantation, so as to form the first body areas B1 as shown in FIG. 2C. The first doped areas D1 and the first body areas B1 collectively form the first support layer 203. The first doped areas D1 and the first body areas B1 are, for example, alternately arranged.

With reference to FIG. 2B and FIG. 2C, in the embodiments of the disclosure, the first initial support layer 203a may be a silicon carbon nitride layer, and the material for performing ion doping includes the atoms with small atomic numbers, such as hydrogen atoms, helium atoms, or boron atoms. Since the hydrogen atoms, the helium atoms or the boron atoms have small radii, the hydrogen atoms, the helium atoms or the boron atoms may be easily doped into silicon carbon nitride. Hereinafter, an ion doping process is described in detail by taking the hydrogen atoms as doping ions as an example. After the hydrogen atoms are doped into the silicon nitride layer, part of silicon-nitrogen bonds (Si—N) and part of silicon-carbon bonds (Si—C) in the silicon carbon nitride will be broken, and new silicon-hydrogen bonds (Si—H) will be generated. Since each of the bond energy of the Si—N bonds and the Si—C bonds in the silicon carbon nitride is greater than the bond energy of the Si—H bonds, the Si—N bonds and the Si—C bonds which are not subjected to ion doping are more stable. Therefore, the hardness of the silicon carbon nitride which is not subjected to ion doping (corresponding to the first body area B1 in the disclosure) is higher. After the hydrogen atoms are used to perform doping, since new Si—H bonds are formed, the hardness of the doped silicon carbon nitride (corresponding to the first doped area D1 in the disclosure) is reduced, that is, the doped silicon carbon nitride becomes soft, and thus is easier to be etched. That is to say, the etching selectivity ratio of the first doped area D1 to the base 200 is greater than the etching selectivity ratio of the first body area B1 to the base 200.

With reference to FIG. 2B and FIG. 2C, in the embodiments of the disclosure, since the bond energy of silicon-oxygen bonds (Si—O) in the first sacrificial layer 202 is less than the bond energy of the Si—C bonds, the difference between the bond energy of the Si—H bonds in the first doped area D1 and the bond energy of the Si—O bonds in the first sacrificial layer is reduced. Therefore, when the first doped areas D1 are etched, the first sacrificial layer 202 below the first doped areas D1 may be simultaneously removed. The etching selectivity ratio of the first doped area D1 to the base 200 is reduced compared with the etching selectivity ratio of the first sacrificial layer 202 to the base 200, so that the first doped areas D1 and the first sacrificial layer 202 may be simultaneously removed by etching.

With reference to FIG. 2B and FIG. 2C, in some embodiments, after the first doped areas D1 are formed, the method for forming the semiconductor structure further includes the following operation. The first photoresist layer 204 is removed. In the embodiments of the disclosure, the first photoresist layer 204 may be removed through an ashing process, a dry etching technology, or a wet etching technology.

Figure 2D:
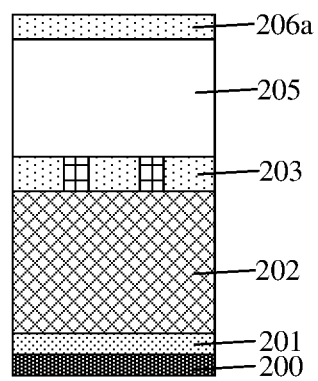
FIG. 2D is a fourth schematic diagram of a forming process of a semiconductor structure according to an embodiment of the disclosure.

As shown in FIG. 2D, in the embodiments of the disclosure, the second sacrificial layer 205 may be a silicon oxide layer, and the second initial support layer 206a may be a silicon carbon nitride layer. Herein, the second sacrificial layer 205 and the second initial support layer 206a may be formed through any suitable deposition process, such as a CVD process, a PVD process, an ALD process, a spin coating process, or a coating process.

Figure 2E:
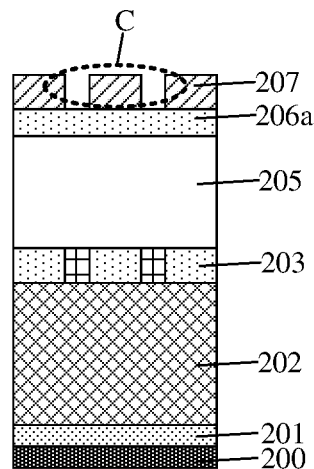
FIG. 2E is a fifth schematic diagrams of a forming process of a semiconductor structure according to an embodiment of the disclosure.
Figure 2F:
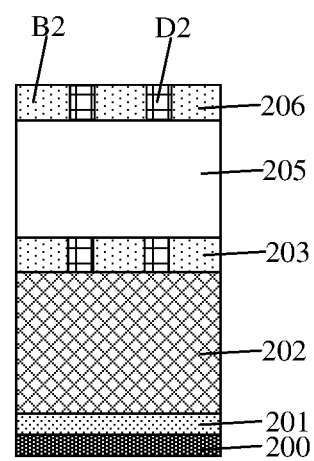
FIG. 2F is a sixth schematic diagram of a forming process of a semiconductor structure according to an embodiment of the disclosure.

As shown in FIG. 2E and FIG. 2F, the second support layer 206 includes second doped areas D2 and second body areas B2. The second doped areas D2 are formed by performing ion implantation on a portion of the second initial support layer 206a. For example, the second doped areas D2 may be formed by the following operations. A second photoresist layer 207 is formed on a surface of the second initial support layer 206a, in which the second photoresist layer 207 includes preset patterns C, and the preset patterns C expose a portion of the surface of the second initial support layer 206a. Ion implantation is performed on the exposed second initial support layer 206a to form the second doped areas D2.

With reference to FIG. 2E and FIG. 2F, in the embodiments of the disclosure, atoms with small atomic numbers, such as hydrogen atoms, helium atoms or boron atoms, may be used to perform ion implantation on the exposed second initial support layer 206a under the process parameters that the ion implantation angle is comprised between 0 degree and 55 degrees, the ion implantation energy is comprised between 1000 electron volts and 100000 electron volts, and the ion implantation dose is comprised between $10^{13}$ atoms/$mm^2$ and $10^{16}$ atoms/$mm^2$, so as to form the second doped areas D2 as shown in FIG. 2F. The portion of the second initial support layer 206a covered by the second photoresist layer 207 is not subjected to the ion implantation, so as to form the second body areas B2 as shown in FIG. 2F. The second doped areas D2 and the second body areas B2 collectively form the second support layer 206.

With reference to FIG. 2E and FIG. 2F, in the embodiments of the disclosure, the second initial support layer 206a may be a silicon carbon nitride layer, and the material for performing ion doping includes the atoms with small atomic numbers, such as hydrogen atoms, helium atoms, or boron atoms. Since the hydrogen atoms, the helium atoms or the boron atoms have small radii, the hydrogen atoms, the helium atoms or the boron atoms may be easily doped into silicon carbon nitride. Hereinafter, an ion doping process is described in detail by taking the boron atoms as doping ions as an example. After the boron atoms are doped into the silicon nitride layer, part of Si—N bonds and part of Si—C bonds in the silicon carbon nitride will be broken, and new silicon-boron bonds (Si—B) will be generated. Since each of the bond energy of the Si—N bonds and the Si—C bonds in the silicon carbon nitride is greater than the bond energy of the Si—B bonds, the Si—N bonds and the Si—C bonds which are not subjected to ion doping are more stable. Therefore, the hardness of the silicon carbon nitride which is not subjected to ion doping (corresponding to the second body area B2 in the disclosure) is higher. After the boron atoms are used to perform ion doping, since new Si—H bonds are formed, the hardness of the doped silicon carbon nitride (corresponding to the second doped area D2 in the disclosure) is reduced, that is, the doped silicon carbon nitride becomes soft, and thus is easier to be etched. That is to say, the etching selectivity ratio of the second doped area D2 to the base 200 is greater than the etching selectivity ratio of the second body area B2 to the base 200.

With reference to FIG. 2E and FIG. 2F, in the embodiments of the disclosure, since the bond energy of the Si—O bonds in the second sacrificial layer 205 is less than the bond energy of the Si—C bonds, the difference between the bond energy of the Si—B bonds in the second doped area D2 and the bond energy of the Si—O bonds in the second sacrificial layer is reduced. Therefore, when the second doped areas D2 are etched, the second sacrificial layer 205 below the second doped areas D2 may be simultaneously removed. The etching selectivity ratio of the second doped area D2 to the base 200 is reduced compared with the etching selectivity ratio of the second sacrificial layer 205 to the base 200, so that the second doped areas D2 and the second sacrificial layer 205 may be simultaneously removed by etching.

With reference to FIG. 2E and FIG. 2F, in some embodiments, after the second doped areas D2 are formed, the method for forming the semiconductor structure further includes the following operation. The second photoresist layer 207 is removed. In the embodiments of the disclosure, the second photoresist layer 207 may be removed through an ashing process, a dry etching technology, or a wet etching technology.

It should be noted that, in the embodiments of the disclosure, the doping concentration of the first doped area may or may not be equal to the doping concentration of the second doped area. In the embodiments of the disclosure, the doping concentration of each of the first doped area and the second doped area is not limited. For example, the doping concentration of the first doped area is equal to that of the second doped area, so that it can ensure that the first doped area and the second doped area have the same etching rate. Meanwhile, the doping ions in the first doped area may also be the same or different from the doping ions in the second doped area.

Figure 2G:
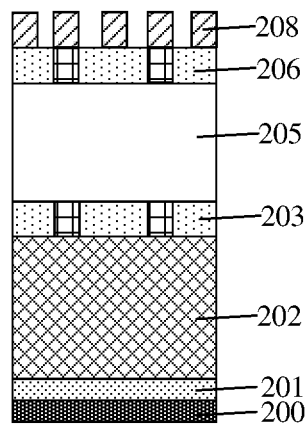
FIG. 2G is a seventh schematic diagram of a forming process of a semiconductor structure according to an embodiment of the disclosure.
Figure 2H:
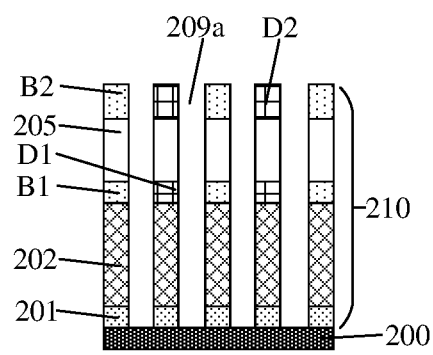
FIG. 2H is an eighth schematic diagram of a forming process of a semiconductor structure according to an embodiment of the disclosure.
Figure 2I:
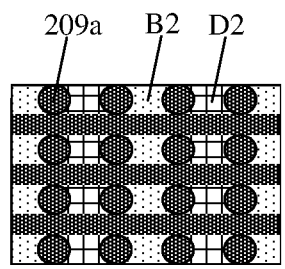
FIG. 2I is a ninth schematic diagram of a forming process of a semiconductor structure according to an embodiment of the disclosure.

Then, with reference to FIG. 2G to FIG. 2I, S102 may be performed, in which a first etching process is performed to form a plurality of first gaps 209a penetrating through the body areas and the sacrificial layers in the laminate structure.

As shown in FIG. 2G and FIG. 2H, in some embodiments, the first gaps 209a may be formed by the following operations. A patterned mask layer 208 is formed on a surface of the laminate structure. The second support layer 206, the second sacrificial layer 205, the first support layer 203, the first sacrificial layer 202, and the bottom support layer 201 are sequentially etched through the patterned mask layer 208, until the surface of the base 200 is exposed, so as to form the first gaps 209a and the stack structure 210.

With reference to FIG. 2G and FIG. 2H, the patterned mask layer 208 in the embodiments of the disclosure may be formed by performing pattern multiplication on a plurality of hard mask layers through a Self-aligned Double Patterning (SADP) technology. The patterned mask layer 208 has patterns for defining the first gaps 209a. The second support layer 206, the second sacrificial layer 205, the first support layer 203, the first sacrificial layer 202, and the bottom support layer 201 are sequentially etched through the patterned mask layer 208, until the surface of the base 200 is exposed, so as to form the plurality of first gaps 209a as shown in FIG. 2H, and the remaining laminate structure after etching forms the stack structure 210 as shown in FIG. 2H. In the embodiments of the disclosure, the stack structure 210 includes two types of stack layers. One type is a stack layer composed of the bottom support layer 201, the first sacrificial layer 202, the first body area B1, the second sacrificial layer 205, and the second body area B2, and the other type is a stack layer composed of the bottom support layer 201, the first sacrificial layer 202, the first doped area D1, the second sacrificial layer 205, and the second doped area D2.

FIG. 2I is a top view of a first gap according to an embodiment of the disclosure. As shown in FIG. 2I, the first gaps 209a penetrating through the laminate structure are arranged in an array. It should be noted that, in the embodiments of the disclosure, an etching process of the first gaps 209a is only exemplarily shown along one direction. Actually, it is necessary to etch the first gaps 209a along two directions during etching.

Figure 2J:
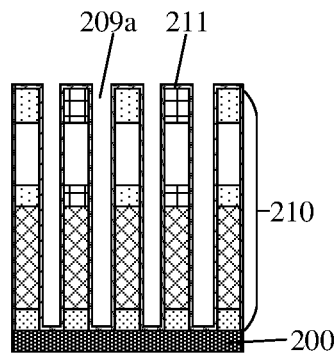
FIG. 2J is a tenth schematic diagram of a forming process of a semiconductor structure according to an embodiment of the disclosure.

Then, with reference to FIG. 2J, S103 may be performed, in which a first material layer 211 is deposited on inner walls of the plurality of first gaps 209a.

As shown in FIG. 2J, in the embodiments of the disclosure, the first material layer 211 is also formed on top surface of the stack structure 210, while the first material layer 211 is deposited on the inner walls of the first gaps 209a. In the embodiments of the disclosure, the first material layer 211 may be formed through any suitable deposition process.

Figure 2K:
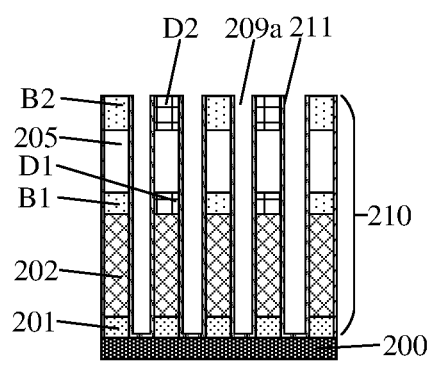
FIG. 2K is an eleventh schematic diagram of a forming process of a semiconductor structure according to an embodiment of the disclosure.
Figure 2L:
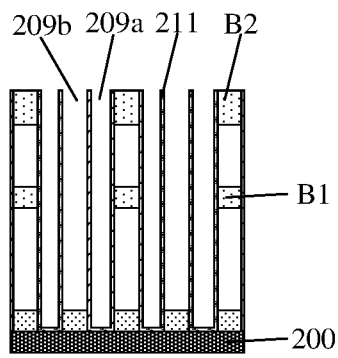
FIG. 2L is a twelfth schematic diagram of a forming process of a semiconductor structure according to an embodiment of the disclosure.

Then, with reference to FIG. 2K and FIG. 2L, S104 may be performed, in which a second etching process is performed to remove the doped areas and the sacrificial layers, so as to form a second gap 209b between any two adjacent first gaps 209a.

As shown in FIG. 2K, in some embodiments, before the doped areas and the sacrificial layers in the stack structure 210 are removed, the method for forming the semiconductor structure further includes the following operations. The first material layer 211 on the top portion of the stack structure 210 is removed, so as to expose the second doped areas D2 and the second body areas B2 in the stack structure 210. In the embodiments of the disclosure, the first material layer 211 on the top portion of the stack structure 210 may be removed through a dry etching process, such as a plasma etching process, a reactive ion etching process or an ion milling process.

As shown in FIG. 2K and FIG. 2L, in the embodiments of the disclosure, the operation that the doped areas and the sacrificial layers in the stack structure 210 are removed may be performed by simultaneously removing the second doped areas D2 in the stack structure 210, the second sacrificial layer 205 in the stack structure 210, the first doped areas D1 in the stack structure 210, and the first sacrificial layer 202 in the stack structure 210 through a wet etching technology, so as to form the second gap 209b located between any two adjacent first gaps 209a. For example, the second doped areas D2 in the stack structure 210, the second sacrificial layer 205 in the stack structure 210, the first doped areas D1 in the stack structure 210, and the first sacrificial layer 202 in the stack structure 210 are simultaneously removed by etching by using a Dilute HydroFluoric (DHF) acid solution and a mixed solution of hydrofluoric acid and ammonium fluoride at the process temperature between 20° C. and 60° C., such as between 30° C. and 50° C., and the first material layer 211 located on side walls of the first gaps 209, the second body areas B2 in the stack structure 210, and the first body areas B1 in the stack structure 210 are remained, so as to form the second gap 209b between any two adjacent first gaps 209a. In the embodiments of the disclosure, since the second body areas B2 are not subjected to ion implantation, the bond energy of the second body area B2 is greater than that of the second doped area D2. That is to say, the second body area B2 is more stable relative to the second doped area D2, that is, the hardness of the second body area B2 is higher than that of the second doped area D2. Since the bond energy of the second body area B2 is greater than that of the second doped area D2, more energy is required to break the bond energy of the second body area B2. That is, the second doped area D2 is easier to be etched than the second body area B2, so that the second doped area D2 may be removed, thereby ensuring that the second body area B2 is not etched. Meanwhile, since the bond energy of the second doped area D2 is close to that of the second sacrificial layer 205, the second doped areas D2 and the second sacrificial layer 205 may be simultaneously removed. Similarly, in the embodiments of the disclosure, the first doped areas D1 and the first sacrificial layer 202 may be simultaneously removed. Therefore, in the embodiments of the disclosure, the second doped areas D2, the second sacrificial layer 205, the first doped areas D1, and the first sacrificial layer 202 may be simultaneously removed, so that the second body areas B2 and the first body areas B1 are remained. The first body areas B1 and the second body areas B2 may be configured to support the capacitor structure, so as to prevent the capacitor structure from collapsing.

In the embodiments of the disclosure, after the first initial support layer and the second initial support layer are doped by using atoms with small atomic numbers, new chemical bonds are generated in the first initial support layer, and the bond energy of the new chemical bonds is less than the bond energy of the original chemical bonds in the first initial support layer or the second initial support layer. Thus, the hardness of the doped first initial support layer (that is, the first doped area) is reduced compared with the undoped first initial support layer (that is, the first body area), and the hardness of the doped second initial support layer (that is, the second doped area) is reduced compared with the undoped second initial support layer (that is, the second body area). Thus, compared with the first body area and the second body area, the first doped area and the second doped area are easier to be removed by etching. Therefore, the second doped areas, the second sacrificial layer, the first doped areas, and the first sacrificial layer in the stack structure may be simultaneously removed in one etching operation, which greatly simplifies the manufacturing process of the semiconductor structure.

Figure 2M:
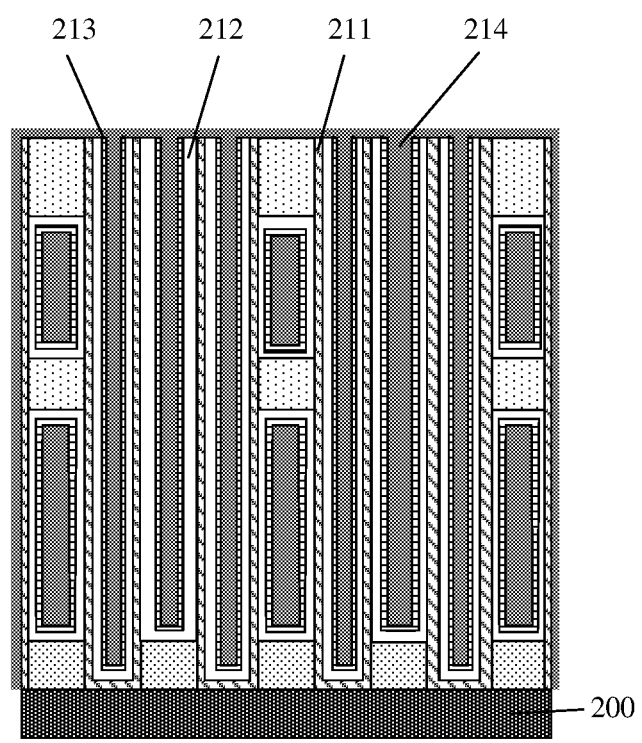
FIG. 2M is a thirteenth schematic diagram of a forming process of a semiconductor structure according to an embodiment of the disclosure.

As shown in FIG. 2L and FIG. 2M, after the second doped areas D2, the second sacrificial layer 205, the first doped areas D1, and the first sacrificial layer 202 in the stack structure 210 are removed, the method for forming the semiconductor structure further includes the following operation. A second material layer 212 and a third material layer 213 are sequentially formed on a surface of the first material layer 211. A gap between the third material layers 213 is filled with a conductive material 214, so as to form a complete capacitor structure. In the embodiments of the disclosure, the second material layer may be configured as a second material layer of the capacitor structure, and the third material layer may be configured as another electrode layer of the capacitor structure, such as an upper electrode of the capacitor structure.

With reference to FIG. 2M, in the embodiments of the disclosure, the second material layer 212 may be a zirconia layer and/or an alumina layer, or may also be other high dielectric constant material layers. The third material layer 213 may also be a titanium nitride layer, a metal titanium layer, a titanium oxide layer, or other metal film layers. The third material layer 213 may be the same as or different from the first material layer 211. The conductive material 214 may be polycrystalline silicon, or may also be any other suitable conductive material, such as tungsten, cobalt, or doped polycrystalline silicon.

The height of the formed capacitor structure in the embodiments of the disclosure is comprised between 600 nm and 1300 nm, which, for example, may be comprised between 800 nm and 1000 nm. The critical dimension of the capacitor is comprised between 30 nm and 60 nm, which, for example, may be comprised between 35 nm and 50 nm.

In the method for forming the semiconductor structure provided by the embodiments of the disclosure, the first support layer in the laminate structure includes the first doped areas with a lower hardness, the second support layer in the laminate structure includes the second doped areas with a lower hardness, and the positions of the first doped areas correspond to the positions of the second doped areas. Thus, in the subsequent process, the first doped areas with the lower hardness in the stack structure and the second doped areas with the lower hardness in the stack structure may be simultaneously removed by etching with the first sacrificial layer and the second sacrificial layer in the stack structure, thereby simplifying the manufacturing process of the semiconductor structure.

Figure 3:
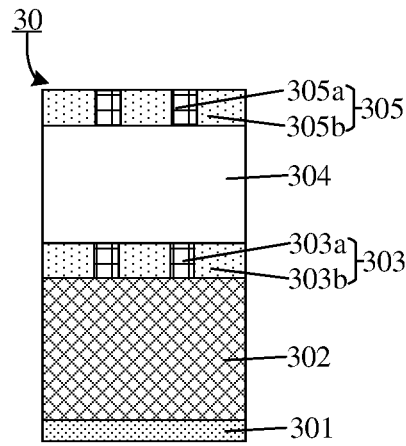
FIG. 3 is a schematic diagram of a laminate structure according to an embodiment of the disclosure.

An embodiment of the disclosure provides a laminate structure. FIG. 3 is a schematic diagram of a laminate structure according to an embodiment of the disclosure. As shown in FIG. 3, the laminate structure 30 includes a plurality of sacrificial layers and a plurality of support layers alternately stacked on one another. The sacrificial layers include a first sacrificial layer 302 and a second sacrificial layer 304. The support layers include a first support layer 303 and a second support layer 305. The laminate structure 30 includes the first sacrificial layer 302, the first support layer 303, the second sacrificial layer 304, and the second support layer 305 sequentially stacked on one another from bottom to top.

With reference to FIG. 3, in some embodiments, the laminate structure 30 further includes a bottom support layer 301. The first sacrificial layer 302 is arranged on a surface of the bottom support layer 301.

In some embodiments, each support layer includes doped areas and body areas, and the hardness of each doped area is lower than the hardness of each body area. With reference to FIG. 3, the first support layer 303 includes first doped areas 303a and first body areas 303b, and the hardness of the first doped area 303a is lower than the hardness of the first body area 303b. The second support layer 305 includes second doped areas 305a and second body areas 305b, and the hardness of the second doped area 305a is lower than the hardness of the second body area 305b. The second doped areas 305a are arranged directly above the first doped areas 303a.

In the laminate structure provided by the embodiments of the disclosure, both the first support layer and the second support layer include doped areas and body areas, and the hardness of each doped area in the first support layer and the second support layer is lower than the hardness of each body area in the first support layer and the second support layer, so that the doped areas in the first support layer and the second support layer are easier to be removed by etching than the body areas. That is, in the embodiments of the disclosure, the body areas and the doped areas in the first support layer and the second support layer have different etching selectivity ratios. Thus, a laminate structure with different etching selectivity ratios may be provided. The laminate structure provided by the embodiments of the disclosure may be configured to form a capacitor hole. After the capacitor hole is formed, a first material layer, a second material layer, and a third material layer may also be formed in the capacitor hole. The forming process of the first material layer, the second material layer, and the third material layer is described with reference to the abovementioned embodiments.

The laminate structure provided by the embodiments of the disclosure is similar to the laminate structure in the abovementioned embodiments. The technical features not disclosed in detail in the embodiments of the disclosure may be understood with reference to the abovementioned embodiments, which are not repeated herein.

Figure 4:
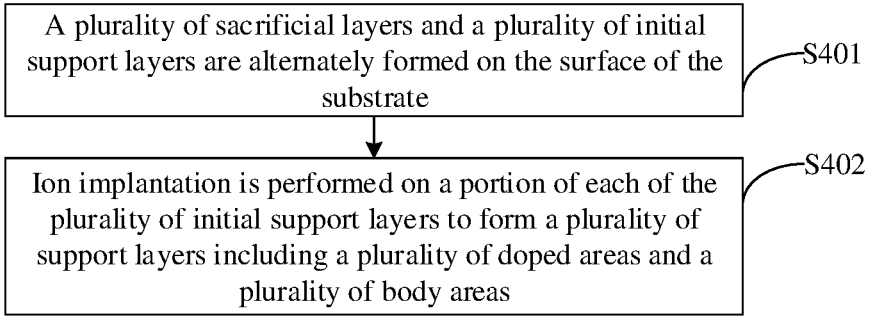
FIG. 4 is a flowchart of a method for forming a laminate structure according to an embodiment of the disclosure.

In addition, an embodiment of the disclosure further provides a method for forming a laminate structure. The laminate structure is arranged on a surface of a base. FIG. 4 is a flowchart of a method for forming a laminate structure according to an embodiment of the disclosure. As shown in FIG. 4, the method for forming the laminate structure includes the following operations.

In S401, a plurality of sacrificial layers and a plurality of initial support layers are sequentially and alternately formed on the surface of the base.

In the embodiments of the disclosure, the laminate structure is configured to form a capacitor structure. The base at least includes a contact structure. The contact structure is configured to be electrically connected to the formed capacitor structure. In other embodiments, the base further includes a semiconductor substrate, a word line structure arranged inside the semiconductor substrate, a bit line structure arranged on the surface of the semiconductor substrate, etc. The initial support layer is configured to support the formed capacitor structure, so as to prevent the capacitor structure from collapsing.

In S402, ion implantation is performed on a portion of each of the plurality of initial support layers to form a plurality of support layers including a plurality of doped areas and a plurality of body areas.

In the embodiments of the disclosure, the atoms with small atomic numbers, such as hydrogen atoms, helium atoms or boron atoms, are used to perform ion implantation on the portion of each initial support layer, so as to form the doped areas. The portions of each initial support layer which are not subjected to the ion implantation form the body areas. The doped areas and the body areas collectively form the support layers.

In the embodiments of the disclosure, the process parameters for performing the ion implantation on the initial support layers include ion implantation angle, ion implantation energy, and ion implantation dose. The ion implantation angle is comprised between 0 degree and 55 degrees, which, for example, may be 10 degrees, 30 degrees, or 50 degrees. The ion implantation energy is comprised between 1000 electron volts and 100000 electron volts, which, for example, may be 5000 electron volts or 60000 electron volts. The ion implantation dose is comprised between $10^{13}$ atoms/mm$^2$ and $10^{16}$ atoms/mm$^2$, which, for example, may be $10^{14}$ atoms/mm$^2$ or $10^{15}$ atoms/mm$^2$.

In the embodiments of the disclosure, the atoms with small atomic numbers, such as hydrogen atoms, helium atoms or boron atoms, are used to perform ion implantation on the portion of each initial support layer, so that the hydrogen atoms, the helium atoms or the boron atoms may be easily doped into the initial support layers. The doped ions may break the original chemical bonds in the initial support layers, and generate new chemical bonds. The bond energy of the new chemical bonds is less than the bond energy of the original chemical bonds in the initial support layers, so that the hardness of the doped initial support layer (that is, the doped area) is reduced relative to the hardness of the undoped initial support layer (that is, the body area). Therefore, the doped areas are easier to be removed by etching than the body areas. Thus, the first support layer with different etching selectivity ratios may be obtained.

In some embodiments, the sacrificial layers include a first sacrificial layer and a second sacrificial layer. The initial support layers include a first initial support layer and a second initial support layer. The support layers include a first support layer and a second support layer. The sacrificial layers and the support layers are formed by the following operations.

In S1, the first sacrificial layer and the first initial support layer are sequentially formed on a surface of the base.

In S2, ion implantation is performed on a portion of the first initial support layer to form the first support layer including the first doped areas and the first body areas.

In S3, the second sacrificial layer and the second initial support layer are sequentially formed on a surface of the first support layer.

In S4, ion implantation is performed on a portion of the second initial support layer to form the second support layer including the second doped areas and the second body areas.

In the embodiments of the disclosure, the process of performing the ion implantation on the first initial support layer and the second initial support layer is the same as the process of performing the ion implantation in the abovementioned embodiments, which is not repeated herein.

In the embodiments of the disclosure, the second doped areas are arranged directly above the first doped areas. The hardness of the first doped area is lower than the hardness of the first body area, and the hardness of the second doped area is lower than the hardness of the second body area.

The method for forming the laminate structure in the embodiments of the disclosure is similar to the laminate structure in the abovementioned embodiments. The technical features not disclosed in detail in the embodiments of the disclosure may be understood with reference to the abovementioned embodiments, which are not repeated herein.

In the laminate structure formed by the method for forming the laminate structure provided by the embodiments of the disclosure, each support layer includes the doped areas and the body areas, and the hardness of the doped area in the support layer is lower than the hardness of the body area in the support layer, so that the doped areas in the support layers are easier to be removed by etching than the body areas in the support layers. That is, in the embodiments of the disclosure, the body areas and the doped areas in the support layers have different etching selectivity ratios. Thus, a laminate structure with different etching selectivity ratios may be manufactured.

In the several embodiments provided in the disclosure, it should be understood that the disclosed device and method may be implemented in non-target manners. The described device embodiments are merely exemplary. For example, the unit division is merely logical function division and may be other division in an actual implementation. For example, a plurality of units or components may be combined or integrated into another system, or some features may be ignored or not performed. In addition, the displayed or discussed components may be coupled or directly coupled to each other.

The units described above as separate components may or may not be physically separated. Components presented as units may or may not be physical units, that is, may be located in one place or may be distributed over multiple network units. Part or all of these units may be selected according to practical requirements to achieve the objectives of the solutions of the embodiments.

The features disclosed in several method or device embodiments provided in the disclosure may be arbitrarily combined without conflicts, so as to obtain new method embodiments or device embodiments.

The above descriptions are only some embodiments of the disclosure, but the protection scope of the embodiments of the disclosure is not limited thereto. Any skilled in the art, within the technical scope disclosed by the disclosure, may easily think of variations or replacements, which should be covered within the protection scope of the disclosure. Therefore, the protection scope of the embodiments of the disclosure should be subject to the protection scope of the claims.

What is claimed is:

1. A method for forming a semiconductor structure, comprising:
   providing a laminate structure, wherein the laminate structure comprises a plurality of sacrificial layers and a plurality of support layers alternately stacked on one another, each of the plurality of support layers comprises a plurality of doped areas and a plurality of body areas, and a hardness of each of the plurality of doped areas is lower than a hardness of each of the plurality of body areas;
   performing a first etching process to form a plurality of first gaps penetrating through the plurality of body areas and the plurality of sacrificial layers in the laminate structure;
   depositing a first material layer on inner walls of the plurality of first gaps; and
   performing a second etching process to remove the plurality of doped areas and the plurality of sacrificial layers to form a second gap between any two adjacent first gaps of the plurality of first gaps.

2. The method for forming the semiconductor structure of claim 1, wherein the plurality of sacrificial layers comprise a first sacrificial layer and a second sacrificial layer, the plurality of support layers comprise a first support layer and a second support layer, and the laminate structure comprises the first sacrificial layer, the first support layer, the second sacrificial layer and the second support layer sequentially stacked on one another; and
   wherein the first support layer comprises a plurality of first doped areas and a plurality of first body areas, the second support layer comprises a plurality of second doped areas and a plurality of second body areas, and wherein the plurality of second doped areas are arranged directly above the plurality of first doped areas, a hardness of each of the plurality of first doped areas is lower than a hardness of each of the plurality of first body areas, and a hardness of each of the plurality of second doped areas is lower than a hardness of each of the plurality of second body areas.

3. The method for forming the semiconductor structure of claim 2, wherein the laminate structure is formed on a base, and wherein providing the laminate structure comprises:
   providing the base;
   sequentially forming the first sacrificial layer and a first initial support layer on a surface of the base;
   performing ion implantation on a portion of the first initial support layer to form the first support layer;
   sequentially forming the second sacrificial layer and a second initial support layer on a surface of the first support layer; and
   performing ion implantation on a portion of the second initial support layer to form the second support layer.

4. The method for forming the semiconductor structure of claim 3, wherein forming the plurality of first doped areas comprises:
   forming a first photoresist layer on a surface of the first initial support layer, wherein the first photoresist layer comprises a plurality of preset patterns, and the plurality of preset patterns expose a portion of the surface of the first initial support layer; and
   performing ion implantation on an exposed portion of the first initial support layer to form the plurality of first doped areas.

5. The method for forming the semiconductor structure of claim 4, wherein ions during the ion implantation are composed of at least one of: hydrogen atoms, helium atoms, or boron atoms.

6. The method for forming the semiconductor structure of claim 4, wherein process parameters during the ion implantation comprise: ion implantation angle, ion implantation energy, and ion implantation dose, and
   wherein the ion implantation angle is comprised between 0 degree and 55 degrees, the ion implantation energy is comprised between 1000 electron volts and 100000 electron volts, and the ion implantation dose is comprised between $10^{13}$ atoms/mm$^2$ and $10^{16}$ atoms/mm$^2$.

7. The method for forming the semiconductor structure of claim 4, wherein an etching selectivity ratio of each of the plurality of first doped areas to the base is greater than an etching selectivity ratio of each of the plurality of first body areas to the base.

8. The method for forming the semiconductor structure of claim 4, wherein forming the plurality of second doped areas comprises:
   forming a second photoresist layer on a surface of the second initial support layer, wherein the second photoresist layer comprises the plurality of preset patterns, and the plurality of preset patterns expose a portion of the surface of the second initial support layer; and
   performing ion implantation on an exposed portion of the second initial support layer to form the plurality of second doped areas.

9. The method for forming the semiconductor structure of claim 8, wherein an etching selectivity ratio of each of the plurality of second doped areas to the base is greater than an etching selectivity ratio of each of the plurality of second body areas to the base.

10. The method for forming the semiconductor structure of claim 2, wherein the laminate structure further comprises a bottom support layer, and the first sacrificial layer is arranged on a surface of the bottom support layer, and wherein forming the plurality of first gaps comprises:
forming a patterned mask layer on a surface of the laminate structure; and
sequentially etching the second support layer, the second sacrificial layer, the first support layer, the first sacrificial layer and the bottom support layer through the patterned mask layer to expose a surface of the base to form the plurality of first gaps and a stack structure.

11. The method for forming the semiconductor structure of claim 10, wherein the first material layer is deposited on a top portion of the stack structure, while depositing the first material layer on the inner walls of the plurality of first gaps.

12. The method for forming the semiconductor structure of claim 11, wherein before removing the plurality of doped areas and the plurality of sacrificial layers, the method further comprises:
removing the first material layer on the top portion of the stack structure to expose the plurality of second doped areas and the plurality of second body areas.

13. The method for forming the semiconductor structure of claim 10, wherein forming the second gap comprises:
simultaneously removing the plurality of second doped areas, the second sacrificial layer, the plurality of first doped areas and the first sacrificial layer in the stack structure through a wet etching process to form the second gap between the any two adjacent first gaps.

14. The method for forming the semiconductor structure of claim 13, wherein an etching solution for the wet etching process comprises: a dilute hydrofluoric acid solution, and a mixed solution of hydrofluoric acid and ammonium fluoride.

15. The method for forming the semiconductor structure of claim 13, wherein a process temperature in the wet etching process is comprised between 20° C. and 60° C.

16. The method for forming the semiconductor structure of claim 1, wherein after removing the plurality of doped areas and the plurality of sacrificial layers, the method further comprises:
sequentially depositing a second material layer and a third material layer on a surface of the first material layer.

17. A method for forming a laminate structure, the laminate structure being arranged on a surface of a base, the method comprising:
alternately forming a plurality of sacrificial layers and a plurality of initial support layers on the surface of the base; and
performing ion implantation on a portion of each of the plurality of initial support layers to form a plurality of support layers each comprising a plurality of doped areas and a plurality of body areas,
wherein a hardness of each of the plurality of doped areas is lower than a hardness of each of the plurality of body areas.

18. The method for forming the laminate structure of claim 17, wherein the plurality of sacrificial layers comprise a first sacrificial layer and a second sacrificial layer, the plurality of initial support layers comprise a first initial support layer and a second initial support layer, and the plurality of support layers comprise a first support layer and a second support layer; and
wherein forming the plurality of sacrificial layers and the plurality of support layers comprises:
sequentially forming the first sacrificial layer and the first initial support layer on the surface of the base;
performing ion implantation on a portion of the first initial support layer to form the first support layer comprising a plurality of first doped areas and a plurality of first body areas;
sequentially forming the second sacrificial layer and the second initial support layer on a surface of the first support layer; and
performing ion implantation on a portion of the second initial support layer to form the second support layer comprising a plurality of second doped areas and a plurality of second body areas, and
wherein the plurality of second doped areas are arranged directly above the plurality of first doped areas, a hardness of each of the plurality of first doped areas is lower than a hardness of each of the plurality of first body areas, and a hardness of each of the plurality of second doped areas is lower than a hardness of each of the plurality of second body areas.

* * * * *